US012581862B2

(12) United States Patent
Kuroda et al.

(10) Patent No.: US 12,581,862 B2
(45) Date of Patent: Mar. 17, 2026

(54) PIEZOELECTRIC FILM, PIEZOELECTRIC STACK, PIEZOELECTRIC ELEMENT, AND METHOD OF MANUFACTURING PIEZOELECTRIC STACK

(71) Applicant: SUMITOMO CHEMICAL COMPANY, LIMITED, Tokyo (JP)

(72) Inventors: Toshiaki Kuroda, Hitachi (JP); Kenji Shibata, Hitachi (JP); Kazutoshi Watanabe, Hitachi (JP); Takeshi Kimura, Hitachi (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 1036 days.

(21) Appl. No.: 17/624,555

(22) PCT Filed: Jul. 2, 2020

(86) PCT No.: PCT/JP2020/026022
§ 371 (c)(1),
(2) Date: Jan. 3, 2022

(87) PCT Pub. No.: WO2021/002434
PCT Pub. Date: Jan. 7, 2021

(65) Prior Publication Data
US 2022/0254988 A1      Aug. 11, 2022

(30) Foreign Application Priority Data

Jul. 4, 2019      (JP) ................................. 2019-125164
Mar. 5, 2020      (JP) ................................. 2020-037495

(51) Int. Cl.
*H01L 41/187*      (2006.01)
*H10N 30/00*      (2023.01)
(Continued)

(52) U.S. Cl.
CPC ....... *H10N 30/8542* (2023.02); *H10N 30/076* (2023.02); *H10N 30/704* (2024.05)

(58) Field of Classification Search
CPC ......................... H10N 30/8542; H10N 30/704
See application file for complete search history.

(56) References Cited

U.S. PATENT DOCUMENTS

2007/0126313 A1      6/2007   Ueno et al.
2009/0121589 A1      5/2009   Kaigawa et al.
(Continued)

FOREIGN PATENT DOCUMENTS

EP            3 901 097 A1      10/2021
JP      2007-184513 A         7/2007
(Continued)

OTHER PUBLICATIONS

European Extended Search Report, dated Jul. 10, 2023, issued in corresponding European Patent Application No. 20835288.0 (9 pages).
(Continued)

*Primary Examiner* — Bryan P Gordon
(74) *Attorney, Agent, or Firm* — Foley & Lardner LLP

(57)      ABSTRACT

A piezoelectric stack including: a substrate; an electrode film; and a piezoelectric film as a poly-crystal film comprising an alkali niobium oxide of a perovskite structure represented by a composition formula of $(K_{1-x}Na_x)NbO_3$ $(0<x<1)$, wherein the piezoelectric film contains at least one element selected from a group consisting of Cu and Mn, and an amount of the element present at a grain boundary of crystals constituting the piezoelectric film is greater than that of the element present in a matrix phase of the crystals.

10 Claims, 3 Drawing Sheets

(51) Int. Cl.
    *H10N 30/076*     (2023.01)
    *H10N 30/853*     (2023.01)

(56)           References Cited

U.S. PATENT DOCUMENTS

| | | | |
|---|---|---|---|
| 2009/0236944 A1 | 9/2009 | Shibata et al. | |
| 2014/0042875 A1* | 2/2014 | Suenaga | H10N 30/04 |
| | | | 29/25.35 |
| 2014/0084754 A1* | 3/2014 | Maejima | H10N 30/704 |
| | | | 310/367 |
| 2014/0265723 A1* | 9/2014 | Aida | B41J 2/045 |
| | | | 347/68 |
| 2018/0301618 A1* | 10/2018 | Shibata | C01G 33/00 |
| 2020/0243748 A1* | 7/2020 | Hirose | C04B 35/62695 |
| 2020/0388746 A1* | 12/2020 | Shibata | H10N 30/076 |

FOREIGN PATENT DOCUMENTS

| | | |
|---|---|---|
| JP | 2008-159807 A | 7/2008 |
| JP | 2009-120443 A | 6/2009 |
| JP | 2015-534257 A | 11/2015 |
| JP | 2018-207055 A | 12/2018 |
| WO | WO-2018/180770 A1 | 10/2018 |

OTHER PUBLICATIONS

Sheng et al., "Annealing effects on the structure and properties of Mn-doped (K0.48NA0.52) NbO3 lead-free piezoceramics", Journal of Materials Science: Materials in Electronics, Chapman and Hall, vol. 29, No. 13, XP036528566, May 5, 2018, pp. 11306-11313.

International Searching Authority, "International Search Report," issued in connection with International Patent Application No. PCT/JP2020/026022, dated Sep. 24, 2020.

International Searching Authority, "Written Opinion," issued in connection with International Patent Application No. PCT/JP2020/026022, dated Sep. 24, 2020.

International Preliminary Report on Patentability received in International Application No. PCT/JP2020/026022 on Jan. 13, 2022 (11 pages).

* cited by examiner

PIEZOELECTRIC FILM, PIEZOELECTRIC STACK, PIEZOELECTRIC ELEMENT, AND METHOD OF MANUFACTURING PIEZOELECTRIC STACK

CROSS-REFERENCE TO RELATED APPLICATIONS

The present application claims priority under 37 U.S.C. § 371 to International Patent Application No. PCT/JP2020/026022, filed Jul. 2, 2020, which claims priority to and the benefit of Japanese Patent Application Nos. 2019-125164, filed on Jul. 4, 2019, and 2020-037495, filed on Mar. 5, 2020. The contents of these applications are hereby incorporated by reference in their entireties.

TECHNICAL FIELD

The present disclosure relates to a piezoelectric film, a piezoelectric stack, a piezoelectric element, and a method of manufacturing a piezoelectric stack.

DESCRIPTION OF THE RELATED ART

A piezoelectric material is utilized widely for functional electronic components such as sensors and actuators. A lead-based material, particularly a PZT-based ferroelectric substance represented by a composition formula of $Pb(Zr_{1-x}Ti_x)O_3$ is widely used as the piezoelectric material. Since the PZT-based piezoelectric material contains lead, it is not preferable from a viewpoint of preventing pollution and the like. Therefore, a potassium sodium niobium oxide (KNN) is proposed as a piezoelectric material not containing lead (see, e.g., patent documents 1 and 2). In recent years, there is a strong demand for further improving a performance of the piezoelectric material comprising a material not containing lead such as the KNN.

PRIOR ART DOCUMENT

Patent Document

Patent Document 1: Japanese Patent Laid Open Publication No. 2007-184513
Patent Document 2: Japanese Patent Laid Open Publication No. 2008-159807

SUMMARY

Problems to be Solved by the Disclosure

It is an object of the present disclosure to further extend a life of a piezoelectric film comprising an alkali niobium oxide (e.g., a potassium sodium niobium oxide).

Means for Solving the Problem

According to an aspect of the present disclosure,
there is provided a piezoelectric film and a related technique thereof,
being a poly-crystal film comprising a potassium sodium niobium oxide, and
containing at least one element selected from a group consisting of Cu and Mn,
wherein an amount of the element present at a grain boundary of crystals is greater than that of the element present in a matrix phase of the crystals.

Advantage of the Disclosure

According to the present disclosure, it is possible to further extend a life of a piezoelectric film comprising an alkali niobium oxide (e.g., a potassium sodium niobium oxide).

DETAILED DESCRIPTION

Embodiment of the Present Disclosure

Figure 1:
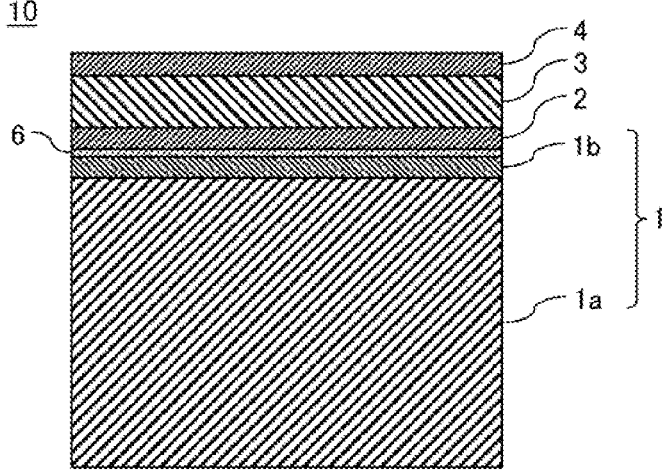
FIG. 1 is a view illustrating an example of a cross-sectional structure of a piezoelectric stack according to an embodiment of the present disclosure.
Figure 2:
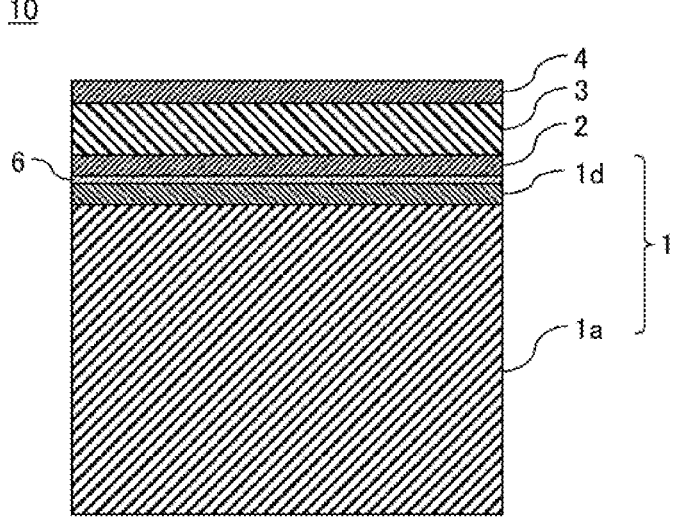
FIG. 2 is a view illustrating a modified example of a cross-sectional structure of a piezoelectric stack according to the embodiment of the present disclosure.

An embodiment of the present disclosure will be explained hereafter with reference to the drawings.
(1) Configuration of Piezoelectric Stack
As illustrated in FIG. 1, a stack (stacked substrate) 10 (also referred to as a piezoelectric stack 10 hereafter) including a piezoelectric film according to the present embodiment includes a substrate 1, a bottom electrode film 2 formed (deposited) on the substrate 1, a piezoelectric film (piezoelectric thin film) 3 deposited on the bottom electrode film 2, and a top electrode film 4 deposited on the piezoelectric film 3.
A single-crystal silicon (Si) substrate 1a on which a surface oxide film ($SiO_2$-film) 1b such as a thermal oxide film or a CVD (Chemical Vapor Deposition) oxide film is formed, that is, a Si-substrate having the surface oxide film, can be preferably used as the substrate 1. Further, as illustrated in FIG. 2, a Si-substrate 1a having an insulating film 1d formed on a surface thereof may also be used as the substrate 1, the insulating film 1d being formed of an insulating material other than $SiO_2$. Further, a Si-substrate 1a in which Si-(100), Si-(111), or the like, is exposed on the surface thereof, that is, a Si-substrate not having the surface oxide film 1b or the insulating film 1d may also be used as the substrate 1. Further, an SOI (Silicon On Insulator) substrate, a quartz glass ($SiO_2$) substrate, a gallium arsenide (GaAs) substrate, a sapphire ($Al_2O_3$) substrate, or a metal substrate formed of a metal material such as stainless steel (SUS) can also be used as the substrate 1. A thickness of the single-crystal Si-substrate 1a can be, for example, 300 μm or more and 1000 μm or less, and a thickness of the surface oxide film 1b can be, for example, 1 nm or more and 4000 nm or less.

The bottom electrode film 2 can be deposited, for example, by using platinum (Pt). The bottom electrode film 2 is a poly-crystal film or a single-crystal film (collectively also referred to as Pt-film hereafter). Preferably, crystals constituting the Pt-film are oriented preferentially in (111) direction with respect to the surface of the substrate 1. That is, a surface of the Pt-film (a surface to be a base of the piezoelectric film 3) is preferably mainly constituted by Pt-(111). The Pt-film can be deposited by a method such as a sputtering method, or an evaporation method. The bottom electrode film 2 may be deposited by using, in place of Pt, various metals such as gold (Au), ruthenium (Ru), or iridium (Ir), alloys containing these as main components, metallic oxides such as strontium ruthenium oxide ($SrRuO_3$, abbreviated as SRO), lanthanum nickel oxide ($LaNiO_3$, abbreviated as LNO), or the like. Further, the bottom electrode film 2 may be a single-layer film deposited by using the above-mentioned various metals or metal oxides; a stack including a Pt-film and a film comprising SRO provided on the Pt-film; a stack including a Pt-film and a film comprising LNO provided on the Pt-film; or the like. For example, an adhesion layer 6 mainly containing, titanium (Ti), tantalum (Ta), titanium oxide ($TiO_2$), nickel (Ni), ruthenium oxide ($RuO_2$), iridium oxide ($IrO_2$), or the like may also be provided between the substrate 1 and the bottom electrode film 2 in order to enhance an adhesion between them. The adhesion layer 6 can be deposited by a method such as the sputtering method, or the evaporation method. A thickness of the bottom electrode film 2 can be, for example, 100 nm or more and 400 nm or less, and a thickness of the adhesion layer 6 can be, for example, 1 nm or more and 200 nm or less.

The piezoelectric film 3 can be deposited, for example, by using an alkali niobium oxide which contains potassium (K), sodium (Na), and niobium (Nb), and which is represented by a composition formula of $(K_{1-x}Na_x)_yNbO_3$. That is, the piezoelectric film 3 can be deposited by using a potassium sodium niobium oxide (KNN). A coefficient x [=Na/(K+Na)] in the above-mentioned composition formula is a value in a range of 0<x<1. A coefficient y [=(K+Na)/Nb] is preferably a value in a range of, for example, $0.7 \leq y \leq 1.50$. The piezoelectric film 3 is a KNN poly-crystal film (also referred to as a KNN-film 3 hereafter). A crystal structure of the KNN is a perovskite structure. The KNN-film 3 can be deposited by a method such as the sputtering method, a PLD (Pulsed Laser Deposition) method, or a sol-gel method. A thickness of the KNN-film 3 is, for example, 0.5 μm or more and 5 μm or less.

Preferably, crystals constituting the KNN-film 3 are oriented preferentially in (001) direction with respect to the surface of the substrate 1 (Si-substrate 1a, in a case where the substrate 1 is, for example, the Si-substrate 1a having the surface oxide film 1b or the insulating film 1d). That is, a surface of the KNN-film 3 (a surface to be a base of the top electrode film 4) is preferably mainly constituted by KNN-(001). By depositing the KNN-film 3 directly on the Pt-film oriented preferentially in (111) direction with respect to the surface of the substrate 1, the crystals constituting the KNN-film 3 can be easily oriented preferentially in (001) direction with respect to the surface of the substrate 1. For example, 80% or more crystals in a crystal group constituting the KNN-film 3 can be oriented in (001) direction with respect to the surface of the substrate 1, and 80% or more regions of the surface of the KNN-film 3 can be easily the KNN-(001).

It is preferable that half or more crystals in the crystal group constituting the KNN-film 3 have a columnar structure. Boundaries between the crystals constituting the KNN-film 3, that is, crystal grain boundaries present in the KNN-film 3 preferably penetrate in a thickness direction of the KNN-film 3. For example, the KNN-film 3 preferably has more crystal grain boundaries that penetrate in the thickness direction of the KNN-film 3 than crystal grain boundaries that do not penetrate in the thickness direction of the KNN-film 3 (e.g., crystal grain boundaries parallel to a planar direction of the substrate 1).

An average grain size of the crystals (crystal group) constituting the KNN-film 3 (also referred to as "average crystal grain size of the KNN-film 3" hereafter) is preferably 100 nm or more, for example. The average crystal grain size of the KNN-film 3 used herein indicates an average crystal grain size in a cross-section of the KNN-film 3 in the planar direction of the substrate 1. The average crystal grain size of the KNN-film 3 can be obtained by image analysis of a visual field of an image taken with a scanning electron microscope (e.g., SEM image) or an image taken with a transmission electron microscope (e.g., TEM image). For example, "ImageJ" created by Wayne Rasband can be used as an image analysis software.

Since the average crystal grain size of the KNN-film 3 is increased, a grain boundary density in the KNN-film 3 can be reduced. The grain boundary density used herein indicates a value obtained by dividing a total length of the grain boundaries of the crystals in the cross-section of the KNN-film 3 in the planar direction of the substrate 1 by a cross-sectional area (=(Total length of the grain boundaries of the crystal grains)/(Cross-sectional area)).

From a viewpoint of reducing the grain boundary density in the KNN-film 3, the larger average crystal grain size of the KNN-film 3 is more preferable. However, when the average crystal grain size of the KNN-film 3 is larger than the thickness of the KNN-film 3, an in-plane uniformity of piezoelectric properties may be reduced in some cases. Therefore, from a viewpoint of suppressing the reduction in the in-plane uniformity of the piezoelectric properties, the average crystal grain size of the KNN-film 3 is preferably smaller than the thickness of the KNN-film 3.

The KNN-film 3 contains copper (Cu). In addition, in the KNN-film 3, Cu is present at the crystal grain boundary, and an amount of Cu present at the crystal grain boundary (e.g., the number of Cu-grains present at the crystal grain boundary) is greater than that of Cu present in a matrix phase (e.g., the number of Cu-grains in the matrix phase) of the crystals constituting the KNN-film 3. Therefore, a movement of oxygen deficiency present at the crystal grain boundary of the KNN-film 3 can be suppressed when applying an electric field to the piezoelectric element 20 (piezoelectric device 30) mentioned later.

The oxygen deficiencies (oxygen vacancies) are present inside and at the grain boundary of the crystals (crystal grains) constituting the KNN-film 3 at a predetermined ratio. Among these oxygen deficiencies, oxygen deficiencies present at the crystal grain boundary of the KNN-film 3, in particular, may move when applying an electric field to the piezoelectric element 20 (piezoelectric device 30) mentioned later, which is produced by processing the piezoelectric stack 10. When an oxygen deficiency moves and reaches the electrode film (the bottom electrode film 2 or the top electrode film 4), the oxygen deficiency reacts with the metal in the electrode film, causing short-circuit. Therefore, the present inventors intensively studied the suppression of the movement of oxygen deficiency present at the crystal grain boundary of the KNN-film 3. As a result, it is found that, in the presence of Cu at the crystal grain boundary of the KNN-film 3, the Cu can be paired with the oxygen deficiency present at the crystal grain boundary of the KNN-film 3, that is, Cu present at the crystal grain boundary can trap the oxygen deficiency to suppress the movement of oxygen deficiency present at the crystal grain boundary. Further, it is also found that such a suppression effect on the movement of oxygen deficiency can be obtained by Cu present at the crystal grain boundary, whereas the suppression effect is hardly obtained by Cu present in the matrix phase of the crystals (inside the crystals) constituting the KNN-film 3 (e.g., Cu or Mn incorporated in a lattice of the crystals constituting the KNN-film 3). These knowledges are found for the first time as a result of the intensive study by the present inventors.

A Cu-content in the KNN-film 3 is preferably in a range of, for example, 0.2 at % or more and 2.0 at % or less relative to an amount of niobium in the KNN-film 3 (poly-crystal film). That is, a Cu-concentration in the KNN-film 3 is preferably 0.2 at % or more and 2.0 at % or less. The term "Cu-concentration" used herein indicates a total concentration of Cu present at the crystal grain boundary and Cu present in the matrix phase.

At the Cu-concentration in the KNN-film 3 of 0.2 at % or more, even when the Cu-content in the KNN-film 3 is very small, a certain amount or more of Cu can be present at the crystal grain boundary, and the amount of Cu present at the crystal grain boundary can be greater than that of Cu present in the matrix phase. As a result, the above-mentioned suppression effect on the movement of oxygen deficiency can be obtained. At the Cu-concentration in the KNN-film 3 of 2.0 at % or less, a relative dielectric constant of the KNN-film 3 can be a value of a magnitude suitable for applications such as sensors and actuators.

The KNN-film 3 may contain an element other than K, Na, Nb, and Cu, such as manganese (Mn), lithium (Li), Ta, antimony (Sb) in a range where the effect obtained by adding Cu in the above-mentioned range is not impaired, for example, in a range of 5 at % or less (in a case where a plurality of the above-mentioned elements are added, the total concentration is 5 at % or less).

The top electrode film 4 can be deposited, for example, by using various metals such as Pt, Au, aluminum (Al), or Cu, or an alloy of these various metals. The top electrode film 4 can be deposited by a method such as the sputtering method, the evaporation method, a plating method, or a metal paste method. The top electrode film 4 does not greatly affect the crystal structure of the KNN-film 3, unlike the bottom electrode film 2. Therefore, a material, a crystal structure, and a deposition method of the top electrode film 4 are not particularly limited. For example, an adhesion layer mainly containing Ti, Ta, $TiO_2$, Ni, $RuO_2$, $IrO_2$, or the like may also be provided between the KNN-film 3 and the top electrode film 4 in order to enhance an adhesion between them. A thickness of the top electrode film 4 can be, for example, 100 nm or more and 5000 nm or less, and when the adhesion layer is provided, a thickness of the adhesion layer can be, for example, 1 nm or more and 200 nm or less.

(2) Configuration of Piezoelectric Device

Figure 3:
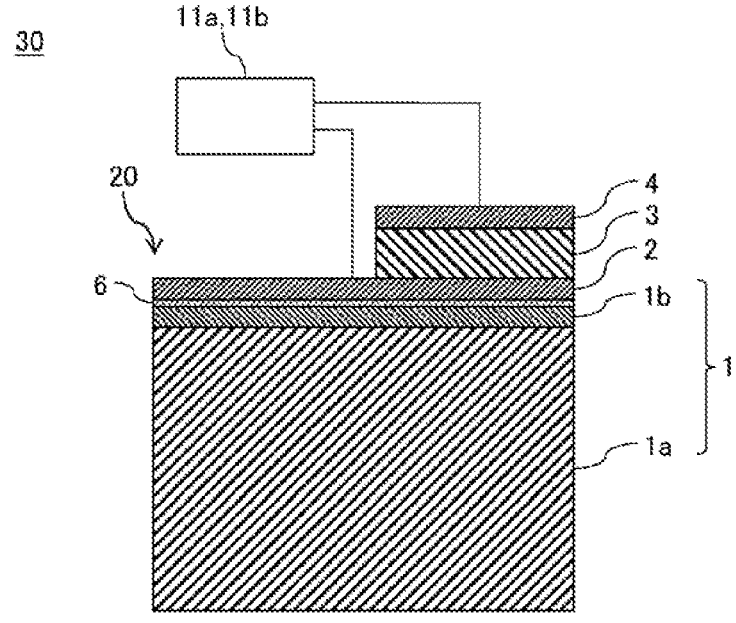
FIG. 3 is a view illustrating an example of a schematic configuration of a piezoelectric device according to the embodiment of the present disclosure.

FIG. 3 is a schematic configuration view of a device 30 including the KNN-film 3 according to the present embodiment (also referred to as a piezoelectric device 30 hereafter). The piezoelectric device 30 includes at least an element 20 (an element 20 including the KNN-film 3, also referred to as a piezoelectric element 20 hereafter) obtained by shaping the above-mentioned piezoelectric stack 10 into a predetermined form, and a voltage applicator 11*a* or a voltage detector 11*b* connected to the piezoelectric element 20. The voltage applicator 11*a* is a means for applying a voltage between the bottom electrode film 2 and the top electrode film 4 (between the electrodes), and the voltage detector 11*b* is a means for detecting a voltage generated between the bottom electrode film 2 and the top electrode film 4 (between the electrodes). Various known means can be used as the voltage applicator 11*a* and the voltage detector 11*b*.

By connecting the voltage applicator 11*a* between the bottom electrode film 2 and the top electrode film 4 of the piezoelectric element 20, the piezoelectric device 30 can function as an actuator. By applying a voltage between the bottom electrode film 2 and the top electrode film 4 using the voltage applicator 11*a*, the KNN-film 3 can be deformed. Various structures connected to the piezoelectric device 30 can be actuated due to the deformation motion. In this case, examples of the application of the piezoelectric device 30 include heads for inkjet printers, MEMS mirrors for scanners, and vibrators for ultrasonic generators.

By connecting the voltage detector 11*b* between the bottom electrode film 2 and the top electrode film 4 of the piezoelectric element 20, the piezoelectric device 30 can function as a sensor. Some change in physical quantity is accompanied by the deformation of the KNN-film 3, which in turn generates a voltage between the bottom electrode film 2 and the top electrode film 4. By detecting the voltage using the voltage detector 11*b*, a magnitude of the physical quantity applied to the KNN-film 3 can be measured. In this case, examples of the applications of the piezoelectric device 30 include angular velocity sensors, ultrasonic sensors, pressure sensors, and acceleration sensors.

(3) Method of Manufacturing Piezoelectric Stack, Piezoelectric Element, and Piezoelectric Device A method of manufacturing the piezoelectric stack 10, the piezoelectric element 20, and the piezoelectric device 30 mentioned above will be explained with reference to FIG. 4.

Figure 4:
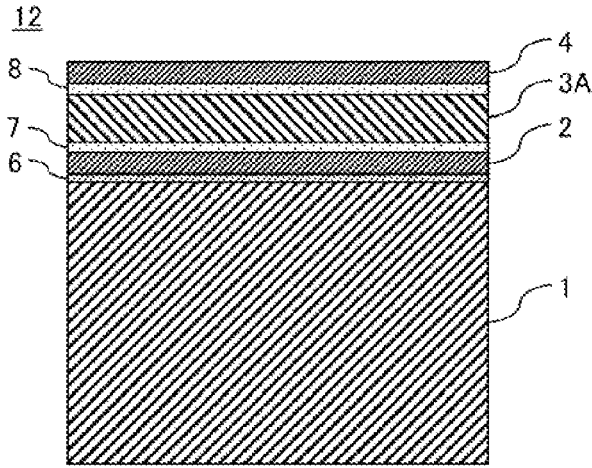
FIG. 4 is a view illustrating an example of a cross-sectional structure of an intermediate (a stack before a heat-treatment) for producing a piezoelectric stack according to the embodiment of the present disclosure.

As illustrated in FIG. 4, the substrate 1 is firstly prepared, and the adhesion layer 6 (Ti-layer) and the bottom electrode film 2 (Pt-film) are deposited in this order on any one of main surfaces of the substrate 1, for example, by the sputtering method. It is also acceptable to prepare the substrate 1 with the adhesion layer 6 or the bottom electrode film 2 deposited on any one of the main surfaces of the substrate 1 in advance.

The following conditions are exemplified as the conditions for providing the adhesion layer 6.

Temperature (substrate temperature): 100° C. or more and 500° C. or less, preferably 200° C. or more and 400° C. or less RF power: 1000 W or more and 1500 W or less, preferably 1100 W or more and 1300 W or less Atmosphere: Argon (Ar) gas atmosphere Atmosphere pressure: 0.1 Pa or more and 0.5 Pa or less, preferably 0.2 Pa or more and 0.4 Pa or less Formation time: 30 seconds or more and 3 minutes or less, preferably 45 seconds or more and 2 minutes or less The following conditions are exemplified as the conditions for depositing the bottom electrode film 2.

Temperature (substrate temperature): 100° C. or more and 500° C. or less, preferably 200° C. or more and 400° C. or less RF power: 1000 W or more and 1500 W or less, preferably 1100 W or more and 1300 W or less Atmosphere: Ar-gas atmosphere Atmosphere pressure: 0.1 Pa or more and 0.5 Pa or less, preferably 0.2 Pa or more and 0.4 Pa or less Deposition time: 3 minutes or more and 10 minutes or less, preferably 4 minutes or more and 8 minutes or less, more preferably 5 minutes or more and 6 minutes or less Subsequently, a layer containing Cu is provided on the bottom electrode film 2, that is, at a position to be in contact with a lower surface of the KNN-film 3. Examples of the layer containing Cu include a KNN-film containing Cu. Hereafter, the layer containing Cu provided on the bottom electrode film 2 is also referred to as a first Cu-layer 7. The first Cu-layer 7 is a poly-crystal film or a single-crystal film. The first Cu-layer 7 can be provided by a method such as the sputtering method, or the evaporation method. A thickness of the first Cu-layer 7 can be, for example, 1 nm or more and 200 nm or less. A Cu-concentration in the first Cu-layer 7 will be mentioned later.

When the KNN-film containing Cu as the first Cu-layer 7 is deposited, for example, by the sputtering method, a composition ratio of the first Cu-layer 7 can be adjusted, for example, by controlling a composition of a target material used during a sputtering deposition. The target material can be produced, for example, by mixing and burning $K_2CO_3$-powder, $Na_2CO_3$-powder, $Nb_2O_5$-powder, Cu-powder (or CuO-powder, $Cu_2O$-powder), and the like. The composition of the target material can be controlled by adjusting a mixing ratio of the $K_2CO_3$-powder, the $Na_2CO_3$-powder, the $Nb_2O_5$-powder, and the Cu-powder (or the CuO-powder, the $Cu_2O$-powder).

The following conditions are exemplified as the conditions for providing the KNN-film containing Cu as the first Cu-layer 7, for example, by the sputtering method. A deposition time is set appropriately depending on the thickness of the first Cu-layer 7.

RF power: 2000 W or more and 2400 W or less, preferably 2100 W or more and 2300 W or less Atmosphere: Ar-gas+oxygen ($O_2$) gas atmosphere Atmosphere pressure: 0.2 Pa or more and 0.5 Pa or less, preferably 0.2 Pa or more and 0.4 Pa or less Partial pressure of Ar-gas relative to partial pressure of 02-gas (partial pressure ratio of $Ar/O_2$): 30/1 to 20/1, preferably 27/1 to 22/1

Deposition temperature: 500° C. or more and 600° C. or less, preferably 500° C. or more and less than 600° C., more preferably 550° C. or more and less than 600° C.

Deposition rate: 0.5 μm/hr or more and 2 μm/hr or less, preferably 0.75 μm/hr or more and 1.5 μm/hr or less A KNN-film 3A without Cu (KNN-film 3A not containing Cu) is deposited on the first Cu-layer 7. When the KNN-film 3A not containing Cu is deposited, for example, by the sputtering method, a composition ratio of the KNN-film 3A not containing Cu can be adjusted, for example, by controlling a composition of a target material used during the sputtering deposition. The target material can be produced, for example, by mixing and burning the $K_2CO_3$-powder, the $Na_2CO_3$-powder, the $Nb_2O_5$-powder, and the like. The composition of the target material can be controlled by adjusting a mixing ratio of the $K_2CO_3$-powder, the $Na_2CO_3$-powder, and the $Nb_2O_5$-powder. The conditions for depositing the KNN-film 3A may be similar to the conditions for providing the first Cu-layer 7 mentioned above.

A layer containing or consisting of Cu is provided on the KNN-film 3A not containing Cu, that is, at a position to be in contact with an upper surface of the KNN-film 3A not containing Cu. Hereafter, the layer containing or consisting of Cu provided on the KNN-film 3A not containing Cu is also referred to as a second Cu-layer 8. The second Cu-layer 8 does not greatly affect a crystal structure of the KNN-film

3A not containing Cu, unlike the first Cu-layer 7. Therefore, a material, a crystal structure, and a deposition method of the second Cu-layer 8 are not particularly limited. The second Cu-layer 8 can be provided by a method such as the sputtering method, the evaporation method, or the metal paste method. A thickness of the second Cu-layer 8 can be, for example, 1 nm or more and 200 nm or less. A Cu-concentration in the second Cu-layer 8 as the layer containing Cu will be mentioned later.

The conditions for providing the layer containing Cu as the second Cu-layer 8, for example, by the sputtering method may be similar to the conditions for providing the first Cu-layer 7 mentioned above.

The following conditions are exemplified as the conditions for forming the layer consisting of Cu as the second Cu-layer 8.

Temperature (substrate temperature): room temperature or more and 300° C. or less, preferably room temperature or more and 100° C. or less RF power: 100 W or more and 500 W or less, preferably 150 W or more and 300 W or less, more preferably 200 W or more and 250 W or less Atmosphere: Ar-gas atmosphere Atmosphere pressure: 0.05 Pa or more and 0.5 Pa or less, preferably 0.05 Pa or more and 0.2 Pa or less Formation time: 30 seconds or more and 3 minutes or less, preferably 45 seconds or more and 2 minutes or less Each of the Cu-concentration in the first Cu-layer 7, and the Cu-concentration in the second Cu-layer 8 as the layer containing Cu is adjusted to such a concentration that the Cu-concentration in the KNN-film 3 after a heat-treatment mentioned later becomes in a range of 0.2 at % or more and 2.0 at % or less due to Cu diffused from the first Cu-layer 7 and the second Cu-layer 8 when performing the heat-treatment.

Then, the top electrode film 4 is deposited on the second Cu-layer 8, for example, by the sputtering method. The conditions for depositing the top electrode film 4 may be similar to the conditions for depositing the bottom electrode film 2 mentioned above. As a result, as illustrated in FIG. 4, there is provided the stack 12 including the substrate 1, the bottom electrode film 2, the first Cu-layer 7, the KNN-film 3, the second Cu-layer 8, and the top electrode film 4.

Then, a heat-treatment is performed to the stack 12 under predetermined conditions. Thereby, Cu in the first Cu-layer 7 and the second Cu-layer 8 diffuses into the KNN-film 3A not containing Cu. As a result, the KNN-film 3A not containing Cu becomes the KNN-film 3 which contains Cu at a predetermined concentration, and in which Cu is present at the crystal grain boundary, and in which the amount of Cu present at the crystal grain boundary is greater than that of Cu present in the matrix phase.

The following conditions are exemplified as the conditions for the heat-treatment.

Annealing temperature (stack temperature): 600° C. or more, preferably 600° C. or more and 800° C. or less, more preferably 650° C. or more and 750° C. or less Annealing time: 0.5 hours or more and 12 hours or less, preferably 1 hour or more and 6 hours or less, more preferably 2 hours or more and 3 hours or less Annealing atmosphere: air or nitrogen atmosphere As a result of diffusing Cu in the first Cu-layer 7 and the second Cu-layer 8 to the KNN-film 3A not containing Cu by performing the heat-treatment, the first Cu-layer 7 and the second Cu-layer 8 almost disappear. As a result, there is provided a piezoelectric stack 10 (see FIG. 1) including the substrate 1, the bottom electrode film 2, the KNN-film 3 which contains Cu and in which the amount of Cu present at the crystal grain boundary is greater than that of Cu present in the matrix phase, and the top electrode film 4. As a result of performing the heat-treatment, the first Cu-layer 7 and the second Cu-layer 8 preferably disappear, but the first Cu-layer 7 and the second Cu-layer 8 may remain.

The piezoelectric element 20 as illustrated in FIG. 3 is obtained by shaping this piezoelectric stack 10 into a predetermined form by an etching or the like (the piezoelectric element 20 is obtained by forming a predetermined pattern by performing a microfabrication to the piezoelectric stack 10), and the piezoelectric device 30 is obtained by connecting the voltage applicator 11a or the voltage detector 11b to the piezoelectric element 20. For example, a dry etching method such as a reactive ion etching or a wet etching method by using a predetermined etching liquid can be used as the etching method.

When the piezoelectric stack 10 is shaped by the dry etching, a photoresist pattern as an etching mask for the dry etching is formed on the piezoelectric stack 10 (e.g., on the top electrode film 4) by a photolithography process or the like. A noble metal film (metal mask) such as a chromium (Cr) film, a nickel (Ni) film, a platinum (Pt) film, or a Ti-film may be formed as the etching mask by the sputtering method. Then, the dry etching is performed to the piezoelectric stack 10 (the top electrode film 4, the KNN-film 3, etc.) by using a halogen element-containing gas as an etching gas. Examples of the halogen element include chlorine (Cl), fluorine (F), and the like. $BCl_3$-gas, $SiCl_4$-gas, chlorine ($Cl_2$) gas, $CF_4$-gas, $C_4F_8$-gas, or the like can be used as the halogen element-containing gas.

When the piezoelectric stack 10 is shaped by the wet etching, a silicon oxide ($SiO_x$) film or the like as an etching mask for the wet etching is formed on the piezoelectric stack 10 (e.g., on the top electrode film 4). Then, the piezoelectric stack 10 is immersed, for example, in an etching liquid containing an alkaline aqueous solution of a chelating agent and not containing hydrofluoric acid, and the wet etching is performed to the piezoelectric stack 10 (the top electrode film 4, the KNN-film 3, etc.). An etching liquid obtained by mixing ethylenediaminetetraacetic acid as the chelating agent, aqueous ammonia, and aqueous hydrogen peroxide, can be used as the etching liquid containing the alkaline aqueous solution of the chelating agent and not containing hydrofluoric acid.

(4) Effect Obtained by the Present Embodiment

According to the present embodiment, one or more of the following effects can be obtained.

(a) Since Cu (e.g., Cu-grains) is present at the crystal grain boundary of the KNN-film 3, and the amount of Cu present at the crystal grain boundary of the KNN-film 3 is greater than that of Cu present in the matrix phase of the crystals constituting the KNN-film 3, the movement of oxygen deficiency present at the crystal grain boundary of the KNN-film 3 can be suppressed when applying an electric field to the piezoelectric element 20 (piezoelectric device 30) produced by processing the piezoelectric stack 10. Thereby, the oxygen deficiency that reaches the electrode film (the bottom electrode film 2 or the top electrode film 4) can be reduced, or it may take a longer time for the oxygen deficiency to reach the electrode film. As a result, the life of the KNN-film 3 can be extended. For example, when a highly accelerated life test (abbreviated as HALT) is performed in which a positive or negative electric field of 300 kV/cm is applied to the top electrode film 4 while the piezoelectric stack 10 is heated so that its temperature reaches 200° C., it may take 7600 seconds or more from a start of applying the electric field until the KNN-film 3 undergoes dielectric breakdown under at least one electric field (positive or negative electric field) applying condition. That is, when HALT is performed in which a positive or negative voltage is applied to the top electrode film 4 so that a positive or negative electric field of 300 kV/cm is generated between the bottom electrode film 2 and the top electrode film 4 at a temperature of 200° C., it may take 7600 seconds or more from a start of applying the voltage until the KNN-film 3 undergoes dielectric breakdown under at least one voltage (positive or negative voltage) applying condition. In the present embodiment, it is considered that the KNN-film 3 has undergone dielectric breakdown when a leakage current density flowing through the KNN-film 3 exceeds 30 $mA/cm^2$.

The present inventors performed HALT under the above-mentioned conditions for each of samples 1 to 5 of the KNN-film 3, in which the Cu-content was 0.5 at % (wt %) and the amount of Cu present at the crystal grain boundary was greater than that of Cu present in the matrix phase. Samples 1 to 5 were produced under the same conditions in the condition range indicated in the above-mentioned embodiment. The HALT measurements were as follows: sample 1, 7663 seconds; sample 2, 20057 seconds; sample 3, 32966 seconds; sample 4, 27566 seconds; and sample 5, 31937 seconds. The above-mentioned HALT value is an average of the values measured at seven points within 0.5 mmφ per sample. The average of the HALT measurements for samples 1 to 5 is 24087.8 seconds.

The present inventors also performed HALT under the above-mentioned conditions for each of samples 6 to 11 of the KNN-film 3, in which the Cu-content was 1.0 at % and the amount of Cu present at the crystal grain boundary was greater than that of Cu present in the matrix phase. Samples 6 to 11 were produced under the same conditions in the condition range indicated in the above-mentioned embodiment. The HALT measurements were as follows: sample 6, 30806 seconds; sample 7, 45309 seconds; sample 8, 23811 seconds; sample 9, 33069 seconds; sample 10, 30420 seconds; and sample 11, 35229 seconds. The above-mentioned HALT value is an average of the values measured at seven points within 0.5 mmφ per sample. The average of the HALT measurements for samples 6 to 11 is 33107.33 seconds.

The present inventors also performed HALT under the above-mentioned conditions for each of samples 12 to 17 of the KNN-film 3, in which the Cu-content was 1.0 at % and the amount of Cu present at the crystal grain boundary was greater than that of Cu present in the matrix phase. Samples 12 to 17 were produced under the same conditions in the condition range indicated in the above-mentioned embodiment. The HALT measurements were as follows: sample 12, 24223 seconds; sample 13, 33583 seconds; sample 14, 49063 seconds; sample 15, 38160 seconds; sample 16, 54823 seconds; and sample 17, 26331 seconds. The above-mentioned HALT value is an average of the values measured at seven points within 0.5 mmφ per sample. The average of the HALT measurements for samples 12 to 17 is 37696.17 seconds.

As mentioned above, the present inventors confirmed that when the KNN-film 3 contains Cu at a predetermined concentration, and Cu is present at the crystal grain boundary of the KNN-film 3, and the amount of Cu present at the crystal grain boundary of the KNN-film 3 is greater than that of Cu present in the matrix phase of the crystals constituting the KNN-film 3, the life according to the above-mentioned HALT can be 7600 seconds or more. For example, the present inventors confirmed that when the KNN-film 3 contains Cu at a concentration of 0.5 at % or more and 1.0 at % or less, the life according to the above-mentioned HALT can be 7600 seconds or more and 55000 seconds or less.

In contrast, the present inventors confirmed that a result obtained by performing HALT under the above-mentioned conditions for the KNN-film without Cu present at the crystal grain boundary is less than 7600 seconds.

(b) Since the average crystal grain size of the KNN-film 3 is larger than that of the conventional KNN-film, for example, is 100 nm or more, the grain boundary density in the KNN-film 3 can be reduced. Thereby, for example, a ratio of the oxygen deficiencies present at the crystal grain boundaries of the KNN-film 3 relative to the oxygen deficiencies present inside and at the grain boundaries of the crystals constituting the KNN-film 3 (total oxygen deficiencies in the KNN-film 3) (=oxygen deficiencies present at crystal grain boundaries/total oxygen deficiencies), can be reduced. As a result, the oxygen deficiencies in the KNN-film 3 that move when applying an electric field to the piezoelectric device 30 can be reliably reduced, and the life of the KNN-film 3 can be further extended.

(c) Since the amount of Cu present at the crystal grain boundary of the KNN-film 3 is greater than that of Cu present in the matrix phase, and the average crystal grain size of the KNN-film 3 is large (e.g., 100 nm or more), the life of the KNN-film 3 can be further extended. Since the amount of Cu present at the crystal grain boundary of the KNN-film 3 is greater than that of Cu present in the matrix phase, at least the above-mentioned effect (a), that is, the above-mentioned suppression effect on the movement of oxygen deficiency can be obtained even when the average crystal grain size of the KNN-film 3 is not large (e.g., less than 100 nm).

(d) Since the KNN-film 3 contains Cu at a concentration of, for example, 0.2 at % or more and 2.0 at % or less, the relative dielectric constant of the KNN-film 3 can be a value of a magnitude suitable for applications such as sensors and actuators, while obtaining the suppression effect on the movement of oxygen deficiency due to Cu present at the crystal grain boundary.

Another Embodiment

As mentioned above, explanation has been given specifically for the embodiment of the present disclosure. However, the present disclosure is not limited to the above-mentioned embodiment. As another embodiment of the present disclosure, explanation will be given in detail hereafter for the KNN-film 3 which contains manganese (Mn) in place of Cu and in which an amount of Mn present at the crystal grain boundary is greater than that of Mn present in the matrix phase of the crystals. In the explanation of the present embodiment, difference from the above-mentioned embodiment will be mainly mentioned, and the explanation of the similarity to the above-mentioned embodiment will be omitted.

The KNN-film 3 included in the piezoelectric stack 10 according to another embodiment of the present disclosure contains Mn. In addition, in the KNN-film 3, Mn is present at the crystal grain boundary, and an amount of Mn present at the crystal grain boundary (e.g., the number of Mn-grains present at the crystal grain boundary) is greater than that of Mn present in the matrix phase (e.g., the number of Mn-grains in the matrix phase) of the crystals constituting the KNN-film 3.

Similarly to a case where Cu is present at the crystal grain boundary of the KNN-film 3, it is also found that, in the presence of Mn at the crystal grain boundary of the KNN-film 3, the Mn can be paired with the oxygen deficiency present at the crystal grain boundary of the KNN-film 3, that is, Mn present at the crystal grain boundary can trap the oxygen deficiency to suppress the movement of oxygen deficiency present at the crystal grain boundary. Further, it is also found that such a suppression effect on the movement of oxygen deficiency can be obtained by Mn present at the crystal grain boundary, whereas the suppression effect is hardly obtained by Mn present in the matrix phase of the crystals (inside the crystals) constituting the KNN-film 3 (e.g., Mn incorporated in a lattice of the crystals constituting the KNN-film 3). These knowledges are also found for the first time as a result of the intensive study by the present inventors.

Since the amount of Mn present at the crystal grain boundary is greater than that of Mn present in the matrix phase of the crystals constituting the KNN-film 3, the movement of oxygen deficiency present at the crystal grain boundary of the KNN-film 3 can be suppressed when applying an electric field to the piezoelectric element 20 (piezoelectric device 30), similarly to the above-mentioned embodiment.

An Mn-content in the KNN-film 3 is preferably in a range of, for example, 0.2 at % or more and 2.0 at % or less relative to an amount of niobium in the KNN-film 3 (poly-crystal film). That is, an Mn-concentration in the KNN-film 3 is preferably 0.2 at % or more and 2.0 at % or less. The term "Mn-concentration" used herein indicates a total concentration of Mn present at the crystal grain boundary and Mn present in the matrix phase.

At the Mn-concentration in the KNN-film 3 of 0.2 at % or more, even when the Mn-content in the KNN-film 3 is very small, a certain amount or more of Mn can be present at the crystal grain boundary, and the amount of Mn present at the crystal grain boundary can be greater than that of Mn present in the matrix phase. As a result, the above-mentioned suppression effect on the movement of oxygen deficiency can be obtained. At the Mn-concentration in the KNN-film 3 of 2.0 at % or less, a relative dielectric constant of the KNN-film 3 can be a value of a magnitude suitable for applications such as sensors and actuators.

The KNN-film 3 according to the present embodiment may contain an element other than K, Na, Nb, and Mn, such as Cu, Li, Ta, Sb in a range where the effect obtained by adding Mn in the above-mentioned range is not impaired, for example, in a range of 5 at % or less (in a case where a plurality of the above-mentioned elements are added, the total concentration is 5 at % or less).

Next, a method of manufacturing the piezoelectric stack 10, piezoelectric element 20, and piezoelectric device 30, each including the KNN-film 3, will be explained with reference to FIG. 5.

Figure 5:
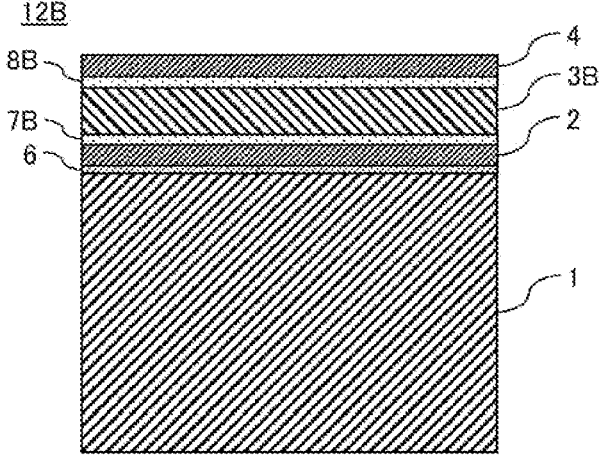
FIG. 5 is a view illustrating an example of a cross-sectional structure of an intermediate (a stack before a heat-treatment) for producing a piezoelectric stack according to another embodiment of the present disclosure.

As illustrated in FIG. 5, the substrate 1 is firstly prepared, and the adhesion layer 6 (Ti-layer) and the bottom electrode film 2 (Pt-film) are deposited in this order on any one of the main surfaces of the substrate 1, by using a method and conditions similar to those in the above-mentioned embodiment. It is also acceptable to prepare the substrate 1 with the adhesion layer 6 or the bottom electrode film 2 deposited on any one of the main surfaces of the substrate 1 in advance.

Subsequently, a layer containing Mn is provided on the bottom electrode film 2. Examples of the layer containing Mn include a KNN-layer containing Mn (KNN-film containing Mn). Hereafter, the layer containing Mn provided on the bottom electrode film 2 is also referred to as a first Mn-layer 7B. The first Mn-layer 7B is a poly-crystal film or a single-crystal film. A thickness of the first Mn-layer 7B can be, for example, 1 nm or more and 200 nm or less. The first Mn-layer 7B can be provided by using a method and conditions similar to those for the first Cu-layer 7.

When the KNN-layer containing Mn as the first Mn-layer 7B is deposited, for example, by the sputtering method, a target material can be produced, for example, by mixing and burning $K_2CO_3$-powder, $Na_2CO_3$-powder, $Nb_2O_5$-powder, Mn-powder (or MnO-powder), and the like. A composition of the target material can be controlled by adjusting a mixing ratio of the $K_2CO_3$-powder, the $Na_2CO_3$-powder, the $Nb_2O_5$-powder, the Mn-powder (or MnO-powder), and the like.

A KNN-film 3B without Mn (KNN-film 3B not containing Mn) is deposited on the first Mn-layer 7B. The KNN-film 3B not containing Mn is a film similar to the KNN-film 3A not containing Cu in the above-mentioned embodiment. The KNN-film 3B not containing Mn can be deposited by using a material, method, conditions similar to those for the KNN-film 3A not containing Cu.

A layer containing or consisting of Mn is provided on the KNN-film 3B not containing Mn, that is, at a position to be in contact with an upper surface of the KNN-film 3B not containing Mn. Examples of the layer containing Mn include the KNN-layer containing Mn (KNN-film containing Mn). Hereafter, the layer containing or consisting of Mn provided on the KNN-film 3B not containing Mn is also referred to as a second Mn-layer 8B. Similarly to the second Cu-layer 8, the second Mn-layer 8B does not greatly affect a crystal structure of the KNN-film 3B not containing Mn. Therefore, a material, a crystal structure, and a deposition method of the second Mn-layer 8B are not particularly limited, and the second Mn-layer 8B can be provided by using a method and conditions similar to those for the second Cu-layer 8. A thickness of the second Mn-layer 8B can be, for example, 1 nm or more and 200 nm or less.

Each of the Mn-concentration in the first Mn-layer 7B, and the Mn-concentration in the second Mn-layer 8B as the layer containing Mn is adjusted to such a concentration that the Mn-concentration in the KNN-film 3 after a heat-treatment mentioned later becomes in a range of 0.2 at % or more and 2.0 at % or less due to Mn diffused from the first Mn-layer 7B and the second Mn-layer 8B when performing the heat-treatment.

Then, the top electrode film 4 is deposited on the second Mn-layer 8B by using a method and conditions similar to those in the above-mentioned embodiment. As a result, as illustrated in FIG. 5, there is provided a stack 12B including the substrate 1, the bottom electrode film 2, the first Mn-layer 7B, the KNN-film 3B not containing Mn, the second Mn-layer 8B, and the top electrode film 4.

Then, the heat-treatment is performed to the stack 12B under conditions similar to those in the above-mentioned embodiment. Thereby, Mn in the first Mn-layer 7B and the second Mn-layer 8B diffuses into the KNN-film 3B not containing Mn. As a result, the KNN-film 3B not containing Mn becomes the KNN-film 3 which contains Mn at a predetermined concentration, and in which Mn is present at the crystal grain boundary, and in which the amount of Mn present at the crystal grain boundary is greater than that of Mn present in the matrix phase.

As a result of diffusing Mn in the first Mn-layer 7B and the second Mn-layer 8B to the KNN-film 3B not containing Mn by performing the heat-treatment, the first Mn-layer 7B and the second Mn-layer 8B almost disappear. As a result, there is provided a piezoelectric stack 10 (see FIG. 1) including the substrate 1, the bottom electrode film 2, the KNN-film 3 which contains Mn and in which the amount of Mn present at the crystal grain boundary is greater than that of Mn present in the matrix phase, and the top electrode film 4. As a result of performing the heat-treatment, the first Mn-layer 7B and the second Mn-layer 8B preferably disappear, but the first Mn-layer 7B and the second Mn-layer 8B may remain.

The piezoelectric element 20 as illustrated in FIG. 3 is obtained by shaping this piezoelectric stack 10 by using a method similar to that in the above-mentioned embodiment, and the piezoelectric device 30 is obtained by connecting the voltage applicator 11a or the voltage detector 11b to the piezoelectric element 20.

According to the present embodiment as well, the effects similar to those in the above-mentioned embodiment can be obtained.

That is, since Mn (e.g., Mn-grains) is present at the crystal grain boundary of the KNN-film 3, and the amount of Mn present at the crystal grain boundary of the KNN-film 3 is greater than that of Mn present in the matrix phase of the crystals constituting the KNN-film 3, similarly to the above-mentioned embodiment, the movement of oxygen deficiency present at the crystal grain boundary of the KNN-film 3 can be suppressed when applying an electric field to the piezo-electric element 20 (piezoelectric device 30) produced by processing the piezoelectric stack 10, and the life of the KNN-film 3 can be extended. For example, when HALT is performed under the conditions similar to those in the above-mentioned embodiment, it may take 7600 seconds or more from a start of applying the electric field until the KNN-film 3 undergoes dielectric breakdown. Also in the present embodiment, it is considered that the KNN-film 3 has undergone dielectric breakdown when a leakage current density flowing through the KNN-film 3 exceeds 30 $mA/cm^2$.

The present inventors performed HALT under the above-mentioned conditions for each of samples 18 to 22 of the KNN-film 3, in which the Mn-content was 0.5 at % (wt %) and the amount of Mn present at the crystal grain boundary was greater than that of Mn present in the matrix phase. Samples 18 to 22 were produced under the same conditions in the condition range indicated in the above-mentioned embodiment. The HALT measurements were as follows: sample 18, 24334.3 seconds; sample 19, 16080.0 seconds; sample 20, 22045.7 seconds; sample 21, 15831.4 seconds; and sample 22, 7602.9 seconds. The above-mentioned HALT value is an average of the values measured at seven points within 0.5 mmφ per sample.

The present inventors performed HALT under the above-mentioned conditions for each of samples 23 to 27 of the KNN-film 3, in which the Mn-content was 1.0 at % (wt %) and the amount of Mn present at the crystal grain boundary was greater than that of Mn present in the matrix phase. Samples 23 to 27 were produced under the same conditions as those for the above-mentioned samples 18 to 22, except that the Mn-content (e.g., the thickness of the first Mn-layer and second Mn-layer, the Mn-concentration in the first Mn-layer and second Mn-layer) was adjusted. The HALT measurements were as follows: sample 23, 30737.1 seconds; sample 24, 25465.7 seconds; sample 25, 9822.9 seconds; sample 26, 24274.3 seconds; and sample 27, 36154.3 seconds. The above-mentioned HALT value is an average of the values measured at seven points within 0.5 mmφ per sample.

As mentioned above, the present inventors confirmed that when the KNN-film 3 contains Mn at a predetermined concentration, and Mn is present at the crystal grain boundary of the KNN-film 3, and the amount of Mn present at the crystal grain boundary of the KNN-film 3 is greater than that of Mn present in the matrix phase of the crystals constituting the KNN-film 3, the life according to the above-mentioned HALT can be 7600 seconds or more. For example, the present inventors confirmed that when the KNN-film 3 contains Mn at a concentration of 0.5 at % or more and 1.0 at % or less, the life according to the above-mentioned HALT can be 7600 seconds or more and 36200 seconds or less.

The present inventors also performed HALT under the above-mentioned conditions for each of samples 28 to 32 of the KNN-film, in which the Mn-content was 0.5 at % and the amount of Mn present at the crystal grain boundary was smaller than that of Mn present in the matrix phase. As for samples 28 to 32, a piezoelectric stack was produced as follows: a KNN-film was deposited on the bottom electrode film without forming the first Mn-layer and the second Mn-layer, using a target material produced by mixing and burning $K_2CO_3$-powder, $Na_2CO_3$-powder, $Nb_2O_5$-powder, and MnO-powder so that the Mn-content in the KNN-film was 0.5 at %; and the top electrode film was deposited on the KNN-film. Moreover, as for samples 28 to 32, the heat-treatment mentioned in the above-mentioned embodiment was not performed. The HALT measurements were as follows: sample 28, 6171.4 seconds; sample 29, 5648.6 seconds; sample 30, 4705.7 seconds; sample 31, 5284.3 seconds; and sample 32, 3428.6 seconds. The above-mentioned HALT value is an average of the values measured at seven points within 0.5 mmφ per sample.

The present inventors also performed HALT under the above-mentioned conditions for each of samples 33 to 37 of the KNN-film, in which the Mn-content was 1.0 at % and the amount of Mn present at the crystal grain boundary was smaller than that of Mn present in the matrix phase. Samples 33 to 37 were produced under the same conditions as those for the above-mentioned samples 28 to 32, except that the mixing ratio of the MnO-powder was changed. The HALT measurements were as follows: sample 33, 5220.0 seconds; sample 34, 4311.4 seconds; sample 35, 7491.4 seconds; sample 36, 4782.9 seconds; and sample 37, 4050.0 seconds. The above-mentioned HALT value is an average of the values measured at seven points within 0.5 mmφ per sample.

As mentioned above, the present inventors confirmed that when the amount of Mn present at the crystal grain boundary is smaller than that of Mn present in the matrix phase even when the Mn-content is in a predetermined range, the life according to the above-mentioned HALT is less than 7600 seconds.

Also in the present embodiment, effects similar to the effects (b), (c), and (d) of the above-mentioned embodiment can be obtained. For example, since the amount of Mn present at the crystal grain boundary of the KNN-film 3 is greater than that of Mn present in the matrix phase, and the average crystal grain size of the KNN-film 3 is large (e.g., 100 nm or more), the life of the KNN-film 3 can be further extended. For example, since the KNN-film 3 contains Mn at a concentration of, for example, 0.2 at % or more and 2.0 at % or less, the relative dielectric constant of the KNN-film 3 can be suppressed from becoming excessively high, and the relative dielectric constant can be a value of a magnitude suitable for applications such as sensors and actuators, while obtaining the suppression effect on the movement of oxygen deficiency due to Mn present at the crystal grain boundary.

MODIFIED EXAMPLES

The present disclosure is not limited to the above-mentioned embodiment and another embodiment (also referred to as the above-mentioned embodiments hereafter), and can be modified as follows. These modified examples can be combined arbitrarily. A case of using the term "KNN-film 3" in the following explanation of these modified examples and the like, includes a case of indicating the KNN-film containing Cu or Mn, a case of indicating the KNN-film not containing Cu or Mn, and a case of indicating both cases.

Modified Example 1

When the KNN-film 3 contains Cu, at least one selected from the group of the first Cu-layer 7 and the second Cu-layer 8 may be provided. When the KNN-film contains Mn, at least one selected from the group of the first Mn-layer 7B and the second Mn-layer 8B may be provided. In these cases, for example, the Cu-concentration in the first Cu-layer 7 or the second Cu-layer 8, or the Mn-concentration in the first Mn-layer 7B or the second Mn-layer 8B is adjusted so that the Cu- or Mn-concentration in the KNN-film 3 after the heat-treatment is 0.2 at % or more and 2.0 at % or less. Also in the present modified example, there can be provided the KNN-film 3 in which the amount of Cu or Mn present at the crystal grain boundary is greater than that of Cu or Mn present in the matrix phase, and the effects similar to those in the above-mentioned embodiments are obtained. However, from a viewpoint of uniformly diffusing Cu or Mn over a thickness direction of the KNN-film 3, it is preferable to provide both of the first Cu-layer 7 and the second Cu-layer 8, or both of the first Mn-layer 7B and the second Mn-layer 8B.

Modified Example 2

When the adhesion layer is provided between the KNN-film 3 and the top electrode film 4, the second Cu-layer 8 or the second Mn-layer 8B is preferably provided before the adhesion layer is provided. The second Cu-layer 8 or the second Mn-layer 8B is preferably provided between the KNN-film 3 (KNN-film 3A not containing Cu or KNN-film 3B not containing Mn) and the adhesion layer, that is, so as to be in contact with the upper surface of the KNN-film 3. It is because when the second Cu-layer 8 or the second Mn-layer 8B is provided between the adhesion layer and the top electrode film 4, the adhesion layer may inhibit Cu or Mn from diffusing from the second Cu-layer 8 or the second Mn-layer 8B to the KNN-film 3 in some cases. Conditions for providing the adhesion layer between the KNN-film 3 and the top electrode film 4 can be similar to the conditions for providing the above-mentioned adhesion layer 6. Also in the present modified example, effects similar to those in the above-mentioned embodiments are obtained.

Modified Example 3

In the deposition of the KNN-film 3 containing Cu, the KNN-film added (doped) with Cu (Cu-containing KNN-film) may be deposited by using the target material mixed with Cu-powder (or CuO-powder, $Cu_2O$-powder). A mixing ratio of the Cu-powder (or the CuO-powder, the $Cu_2O$-powder) in the target material is a ratio such that the Cu-concentration in the KNN-film 3 after the heat-treatment is 0.2 at % or more and 2.0 at % or less, in consideration of Cu diffused from the first Cu-layer 7 and the second Cu-layer 8 to the KNN-film 3 (KNN-film 3A not containing Cu). Similarly, in the deposition of the KNN-film 3 containing Mn, the KNN-film added (doped) with Mn (Mn-containing KNN-film) may be deposited by using the target material mixed with Mn-powder (or MnO-powder, etc.). A mixing ratio of the Mn-powder (or the MnO-powder, etc.) in the target material is a ratio such that the Mn-concentration in the KNN-film 3 after the heat-treatment is 0.2 at % or more and 2.0 at % or less, in consideration of Mn diffused from the first Mn-layer 7B and the second Mn-layer 8B to the KNN-film containing Mn. Conditions for the deposition of the above-mentioned KNN-film containing Cu or KNN-film containing Mn can be similar to the conditions for the deposition of the KNN-film 3A not containing Cu in the above-mentioned embodiments. Also in the present modified example, effects similar to those in the above-mentioned embodiments are obtained.

Modified Example 4

The piezoelectric stack 10 does not have to include the bottom electrode film 2. That is, the piezoelectric stack 10 may be configured to include the substrate 1, the KNN-film (piezoelectric film) 3 which is deposited on the substrate 1 and in which the amount of Cu or Mn at the crystal grain boundary is greater than that of Cu or Mn present in the matrix phase, and the top electrode film 4 (the electrode film 4) which is deposited on the KNN-film 3.

For example, the piezoelectric stack 10 according to the present modified example can be obtained as follows: the stack 12 is produced by depositing the KNN-film 3A not containing Cu on the substrate 1, providing the layer containing or consisting of Cu, that is, the second Cu-layer 8, on the KNN-film 3A not containing Cu, and depositing the electrode film 4 on the second Cu-layer 8; and the heat-treatment is performed to the stack 12. In addition to or in place of the second Cu-layer 8, the layer containing Cu (i.e., the first Cu-layer 7) may be provided between the substrate 1 and the KNN-film 3 (KNN-film 3A not containing Cu).

For example, the piezoelectric stack 10 according to the present modified example can be obtained as follows: the stack 12B is produced by depositing the KNN-film 3B not containing Mn on the substrate 1, providing the layer containing or consisting of Mn, that is, the second Mn-layer 8B, on the KNN-film 3B not containing Mn, and depositing the electrode film 4 on the second Mn-layer 8B; and the heat-treatment is performed to the stack 12B. In addition to or in place of the second Mn-layer 8B, the layer containing Mn (i.e., the first Mn-layer 7B) may be provided between the substrate 1 and the KNN-film 3 (KNN-film 3B not containing Mn).

Conditions for depositing (providing) films (layers) may be similar to the conditions for the films (layers) in the above-mentioned embodiments.

Figure 6:
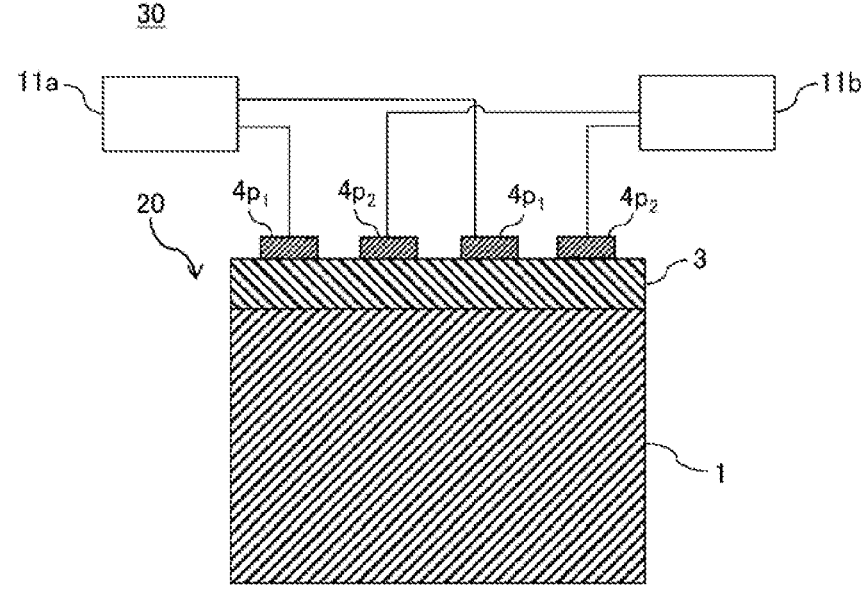
FIG. 6 is a view illustrating a modified example of a schematic configuration of a piezoelectric device according to the embodiment of the present disclosure.

FIG. 6 is a schematic configuration view of the piezoelectric device 30 produced by using the piezoelectric stack 10 according to the present modified example. The piezoelectric device 30 is configured to include at least the piezoelectric element 20 obtained by shaping the piezoelectric stack 10 into a predetermined form, and the voltage applicator 11a and the voltage detector 11b connected to the piezoelectric element 20. In the present modified example, the piezoelectric element 20 includes a pattern electrode formed by shaping the electrode film 4 into a predetermined pattern. For example, the piezoelectric element 20 includes a pair of positive and negative pattern electrodes $4p_1$ on an input side, and a pair of positive and negative pattern electrodes $4p_2$ on an output side. Examples of the pattern electrodes $4p_1$, $4p_2$ include a comb-shaped electrode (Inter Digital Transducer, abbreviated as IDT).

By connecting the voltage applicator 11a between the pattern electrodes $4p_1$, and connecting the voltage detector 11b between the pattern electrodes $4p_2$, the piezoelectric device 30 can function as a filter device such as a filter for surface acoustic wave (abbreviated as SAW). By applying a voltage between the pattern electrodes $4p_1$ using the voltage applicator 11a, SAW can be excited on the surface of the KNN-film 3. A frequency of SAW to be excited can be adjusted, for example, by adjusting a pattern pitch of the pattern electrodes $4p_1$. For example, the shorter the pitch of IDT as the pattern electrode $4p_1$, the higher the frequency of SAW, and the longer the above-mentioned pitch, the lower the frequency of SAW. Among the SAWs which are excited by the voltage applicator 11a, and propagate through the KNN-film 3 to reach the pattern electrode $4p_2$, SAW having a predetermined frequency (frequency component) determined according to, for example, a pitch of IDT as the pattern electrode $4p_2$ generates a voltage between the pattern electrodes $4p_2$. By detecting this voltage using the voltage detector 11b, SAW having a predetermined frequency can be extracted from the excited SAWs. The term "predetermined frequency" used herein can include not only a predetermined frequency but also a predetermined frequency band whose center frequency is equal to the predetermined frequency.

Also in the present modified example, in the KNN-film 3, since the amount of Cu or Mn present at the crystal grain boundary is greater than that of Cu or Mn present in the matrix phase, effects similar to those in the above-mentioned embodiments are obtained.

Modified Example 5

An orientation control layer may be provided between the bottom electrode film 2 and the KNN-film 3 to control an orientation of the crystals constituting the KNN-film 3. The orientation control layer is preferably provided between the bottom electrode film 2 and the first Cu-layer 7 in a case where the first Cu-layer 7 is provided, or between the bottom electrode film 2 and the first Mn-layer 7B in a case where the first Mn-layer 7B is provided. In a case where the bottom electrode film 2 is not provided as mentioned in the modified example 4, the orientation control layer is preferably provided between the substrate 1 and the KNN-film 3 (between the substrate 1 and the first Cu-layer 7 in a case where the first Cu-layer 7 is provided, or between the substrate 1 and the first Mn-layer 7B in a case where the first Mn-layer 7B is provided). The orientation control layer can be formed, for example, by using a material which is a metal oxide such as SRO, LNO, or strontium titanium oxide ($SrTiO_3$, abbreviated as STO), and which is different from the material constituting the bottom electrode film 2. Preferably, crystals constituting the orientation control layer are oriented preferentially in (100) with respect to the surface of the substrate 1.

Modified Example 6

In the above-mentioned embodiments and modified examples, by way of example, explanation has been given for a case where the first Cu-layer 7 and the second Cu-layer 8 are provided, and the heat-treatment is performed to diffuse Cu into the KNN-film 3A not containing Cu (KNN-film 3), or a case where the first Mn-layer 7B and the second Mn-layer 8B are provided, and the heat-treatment is performed to diffuse Mn into the KNN-film 3B not containing Mn (KNN-film 3). However, the present disclosure is not limited to the above-mentioned embodiments and modified examples. For example, Cu may be made to be contained in at least one selected from the group of the bottom electrode film 2 and the top electrode film 4 (the electrode film 4), in place of providing the first Cu-layer 7 and the second Cu-layer 8, or in addition to providing at least one selected from the group of the first Cu-layer 7 and the second Cu-layer 8. Alternatively, for example, Mn may be made to be contained in at least one selected from the group of the bottom electrode film 2 and the top electrode film 4 (the electrode film 4), in place of providing the first Mn-layer 7B and the second Mn-layer 8B, or in addition to providing at least one selected from the group of the first Mn-layer 7B and the second Mn-layer 8B. In this event, Cu or Mn is preferably made to be contained on a side closer to the upper surface (the surface in contact with the KNN-film 3) of the bottom electrode film 2, preferably in the uppermost surface of the bottom electrode film 2, and Cu or Mn is preferably made to be contained on a side closer to the lower surface (the surface in contact with the KNN-film 3) of the top electrode film 4, preferably in the lowermost surface of the top electrode film 4. A concentration of Cu or Mn made to be contained in the bottom electrode film 2 and the top electrode film 4 is a concentration such that a concentration of Cu or Mn in the KNN-film 3 after the heat-treatment can be, for example, 0.2 at % or more and 2.0 at % or less. In the present modified example, when Cu or Mn is made to be contained in the top electrode film 4, an adhesion layer is not preferably provided between the KNN-film 3 and the top electrode film 4. It is because the adhesion layer may inhibit Cu or Mn from diffusing into the KNN-film 3 in some cases, as mentioned above. Other configurations are similar to those in the above-mentioned embodiments and modified examples.

Also in the present modified example, Cu or Mn in the bottom electrode film 2 and the top electrode film 4 (electrode film 4) can be allowed to diffuse into the KNN-film 3 by performing the heat-treatment similar to that in the above-mentioned embodiments. As a result, there can be provided a piezoelectric stack 10 including the KNN-film 3 in which Cu or Mn is present at the crystal grain boundary, and effects similar to those in the above-mentioned embodiments and modified examples can be obtained.

Modified Example 7

In the above-mentioned embodiments and modified examples, by way of example, explanation has been given for a case where at least one selected from the group of the first Cu-layer 7 and the second Cu-layer 8 is provided, and the heat-treatment is performed to produce the KNN-film 3 in which the amount of Cu present at the crystal grain boundary is greater than that of Cu present in the matrix phase, or a case where at least one selected from the group of the first Mn-layer 7B and the second Mn-layer 8B is provided, and the heat-treatment is performed to produce the KNN-film 3 in which the amount of Mn present at the crystal grain boundary is greater than that of Mn present in the matrix phase. However, the present disclosure is not limited to the above-mentioned embodiments and modified examples. For example, the above-mentioned piezoelectric stack 10 can be produced by a manufacturing method mentioned later without providing any of the above-mentioned first Cu-layer 7 and second Cu-layer 8, or without providing any of the above-mentioned first Mn-layer 7B and second Mn-layer 8B.

The KNN-film 3 added (doped) with Cu or Mn is firstly deposited on the bottom electrode film 2 included in the substrate 1. The method and conditions for depositing the KNN-film 3 doped with Cu or Mn can be similar to those in the above-mentioned embodiments and the modified example 3. Then, the top electrode film 4 is deposited on the KNN-film 3. The conditions for depositing (providing) the adhesion layer 6, the bottom electrode film 2, and the top electrode film 4 may be similar to the conditions in the above-mentioned embodiments. Thereby, there is provided the stack 12 (or the stack 12B, collectively referred to as "stack 12" hereafter). Then, the heat-treatment is performed to the stack 12 under predetermined conditions. The conditions for the heat-treatment may be similar to the conditions in the above-mentioned embodiments. After the heat-treatment, the stack 12 is cooled over 20 minutes or more until a temperature of the stack 12 reaches 400° C. Then, the stack 12 is cooled until the temperature of the stack 12 reaches around room temperature (25° C.). By cooling the stack 12 as mentioned above, there can be provided the piezoelectric stack 10 including the KNN-film 3 in which the amount of Cu or Mn present at the crystal grain boundary is greater than that of Cu or Mn present in the matrix phase. Also in the piezoelectric stack 10 produced by the method according to the present modified example, effects similar to those in the above-mentioned embodiments are obtained.

Further Another Embodiment

As mentioned above, explanation has been given specifically for an embodiment, another embodiment, and modified examples of the present disclosure. However, the present disclosure is not limited to the above-mentioned embodiment, another embodiment, and modified examples, and can be variously modified in a range not departing from the gist of the disclosure.

In the above-mentioned embodiments, explanation has been given for a case where the KNN-film 3 contains Cu and the amount of Cu present at the grain boundary of the crystals constituting the KNN-film 3 is greater than that of Cu present in the matrix phase of the crystals, or a case where the KNN-film 3 contains Mn and the amount of Mn present at the grain boundary of the crystals constituting the KNN-film 3 is greater than that of Mn present in the matrix phase of the crystals. However, the present disclosure is not limited to these cases. For example, the KNN-film 3 may contain Cu and Mn, and an amount of Cu and Mn present at the grain boundary of the crystals (e.g., total number of Cu-grains and Mn-grains present at the crystal grain boundary) constituting the KNN-film 3 may be greater than that of Cu and Mn present in the matrix phase (e.g., total number of Cu-grains and Mn-grains present in the matrix phase) of the crystals. Even in this case, effects similar to those in the above-mentioned embodiments are obtained. That is, the KNN-film 3 may be configured so that it contains at least one element selected from the group consisting of Cu and Mn, and the amount of these elements present at the grain boundary of the crystals is greater than that of these elements present in the matrix phase of the crystals. When the KNN-film 3 contains both Cu and Mn, the KNN-film 3 preferably contains Cu and Mn at a total concentration in the range of, for example, 0.2 at % or more and 2.0 at % or less.

For example, when the KNN-film 3 contains Cu, the KNN-film 3 in which the amount of Cu present at the crystal grain boundary is greater than that of Cu present in the matrix phase, may be produced by using a method such as Cu-decoration method. Specifically, first of all, a stack including at least the bottom electrode film 2, the KNN-film 3, and the top electrode film 4, is produced, for example, by using the single-crystal Si-substrate T a on which the surface oxide film 1b is formed. Alternatively, the stack including at least the KNN-film 3 and the electrode film 4 is produced by using the single-crystal Si-substrate 1a. Then, the stack and a platinum plate are immersed in an aqueous copper(II) sulfate (CuSO₄) solution, and an electric field is applied to each of electrodes: the surface oxide film 1b of the Si-substrate 1a as a cathode, and the platinum plate as an anode. As a result, Cu is precipitated at the crystal boundary of the KNN-film 3, resulting in the piezoelectric stack 10 including the KNN-film 3 in which the amount of Cu present at the crystal grain boundary is greater than that of Cu present in the matrix phase. Even in this case, effects similar to those in the above-mentioned embodiments and the modified examples are obtained.

For example, the KNN-film 3 may contain, in addition to or in place of Cu or Mn, another element having an effect equivalent to that of Cu or Mn at a concentration where the relative dielectric constant of the KNN-film 3 can be a value of an appropriate magnitude, while obtaining the above-mentioned suppression effect on the movement of oxygen deficiency. Even in this case, effects similar to those in the above-mentioned embodiments and the modified examples are obtained.

For example, in shaping the above-mentioned piezoelectric stack 10 into the piezoelectric element 20, the substrate 1 may be removed from the piezoelectric stack 10 as long as the piezoelectric device 30 produced by using the piezoelectric stack 10 (piezoelectric element 20) can be applied to desired applications such as sensors and actuators.

<Preferable Aspects of the Present Disclosure>

Preferable aspects of the present disclosure will be supplementarily mentioned hereafter.

(Supplementary Description 1)

According to an aspect of the present disclosure, there is provided a piezoelectric film, being a poly-crystal film comprising a potassium sodium niobium oxide, and containing at least one element selected from a group consisting of copper (Cu) and manganese (Mn), wherein an amount of the element present at a grain boundary of crystals is greater than that of the element present in a matrix phase of the crystals.

(Supplementary Description 2)

Preferably, there is provided the piezoelectric film according to the supplementary description 1, wherein when a positive or negative electric field of 300 kV/cm is applied at a temperature of 200° C. to an electrode film provided on the piezoelectric film, it takes 7600 seconds or more from a start of applying the electric field until a leakage current density flowing through the piezoelectric film exceeds 30 mA/cm² under at least one electric field applying condition.

(Supplementary Description 3)

Preferably, there is provided the piezoelectric film according to the supplementary description 1 or 2, wherein the piezoelectric film is constituted by crystal grains having an average grain size of 100 nm or more.

(Supplementary Description 4)

Preferably, there is provided the piezoelectric film according to any one of the supplementary descriptions 1 to 3, wherein a content of the element is 0.2 at % or more and 2.0 at % or less.

(Supplementary Description 5)

According to another aspect of the present disclosure, there is provided a piezoelectric stack, including: a substrate;

an electrode film; and a piezoelectric film as a poly-crystal film comprising a potassium sodium niobium oxide, that is, a piezoelectric film as a poly-crystal film comprising an alkali niobium oxide of a perovskite structure represented by a composition formula of $(K_{1-x}Na_x)NbO_3$ $(0<x<1)$, wherein the piezoelectric film contains at least one element selected from a group consisting of Cu and Mn, and an amount of the element present at a grain boundary of crystals constituting the piezoelectric film is greater than that of the element present in a matrix phase of the crystals.

(Supplementary Description 6)

According to further another aspect of the present disclosure, there is provided a piezoelectric stack, including: a substrate; an electrode film; and a piezoelectric film as a poly-crystal film comprising a potassium sodium niobium oxide, that is, a piezoelectric film as a poly-crystal film comprising an alkali niobium oxide of a perovskite structure represented by a composition formula of $(K_{1-x}Na_x)NbO_3$ $(0<x<1)$, wherein a grain boundary of crystals constituting the piezoelectric film is decorated with copper (Cu).

(Supplementary Description 7)

Preferably, there is provided the piezoelectric stack according to the supplementary description 5 or 6, wherein when a positive or negative electric field of 300 kV/cm is applied at a temperature of 200° C. to the electrode film provided on the piezoelectric film, it takes 7600 seconds or more from a start of applying the electric field until a leakage current density flowing through the piezoelectric film exceeds 30 mA/cm² under at least one electric field applying condition.

(Supplementary Description 8)

Preferably, there is provided the piezoelectric stack according to any one of the supplementary descriptions 5 to 7, wherein the piezoelectric film is constituted by crystal grains having an average grain size of 100 nm or more.

(Supplementary Description 9)

Preferably, there is provided the piezoelectric stack according to any one of the supplementary descriptions 5 to 8, wherein the piezoelectric film contains the element at a concentration of 0.2 at % or more and 2.0 at % or less.

(Supplementary Description 10)

According to further another aspect of the present disclosure, there is provided a piezoelectric element or piezoelectric device, including: a substrate; a piezoelectric film deposited on the substrate as a poly-crystal film comprising a potassium sodium niobium oxide, that is, a piezoelectric film deposited on the substrate as a poly-crystal film comprising an alkali niobium oxide of a perovskite structure represented by a composition formula of $(K_{1-x}Na_x)NbO_3$ $(0<x<1)$; and an electrode film deposited on the piezoelectric film, wherein the piezoelectric film contains at least one element selected from a group consisting of Cu and Mn, and an amount of the element present at a grain boundary of crystals constituting the piezoelectric film is greater than that of the element present in a matrix phase of the crystals.

(Supplementary Description 11)

According to further another aspect of the present disclosure, there is provided a piezoelectric element or piezoelectric device, including:

a substrate;

a bottom electrode film deposited on the substrate;

a piezoelectric film deposited on the bottom electrode film as a poly-crystal film comprising a potassium sodium niobium oxide, that is, a piezoelectric film deposited on the bottom electrode film as a poly-crystal film comprising an alkali niobium oxide of a perovskite structure represented by a composition formula of $(K_{1-x}Na_x)NbO_3$ $(0<x<1)$; and a top electrode film deposited on the piezoelectric film, wherein the piezoelectric film contains at least one element selected from a group consisting of Cu and Mn, and an amount of the element present at a grain boundary of crystals constituting the piezoelectric film is greater than that of the element present in a matrix phase of the crystals.

(Supplementary Description 12)

According to further another aspect of the present disclosure, there is provided a method of manufacturing a piezoelectric stack, including:

depositing a piezoelectric film on a substrate as a poly-crystal film comprising a potassium sodium niobium oxide, that is, depositing a piezoelectric film on a substrate as a poly-crystal film comprising an alkali niobium oxide of a perovskite structure represented by a composition formula of $(K_{1-x}Na_x)NbO_3$ $(0<x<1)$;

providing a layer containing or consisting of at least one element selected from a group consisting of Cu and Mn on the piezoelectric film;

depositing an electrode film on the layer containing or consisting of the element; and performing a heat-treatment to a stack including the substrate, the piezoelectric film, the layer containing or consisting of the element, and the electrode film, wherein by performing the heat-treatment, the element in the layer containing or consisting of the element is allowed to diffuse into the piezoelectric film, and the piezoelectric film becomes a film which contains the element and in which an amount of the element present at a grain boundary of crystals constituting the piezoelectric film is greater than that of the element present in a matrix phase of the crystals.

(Supplementary Description 13)

According to further another aspect of the present disclosure, there is provided a method of manufacturing a piezoelectric stack, including:

depositing a bottom electrode film on a substrate;

depositing a piezoelectric film on the bottom electrode film as a poly-crystal film comprising a potassium sodium niobium oxide, that is, depositing a piezoelectric film on the bottom electrode film as a poly-crystal film comprising an alkali niobium oxide of a perovskite structure represented by a composition formula of $(K_{1-x}Na_x)NbO_3$ $(0<x<1)$;

depositing a top electrode film on the piezoelectric film;

performing a heat-treatment to a stack including the substrate, the bottom electrode film, the piezoelectric film, and the top electrode film; and performing at least either one of providing a layer containing at least one element selected from a group consisting of Cu and Mn so as to be in contact with a lower surface of the piezoelectric film before the deposition of the piezoelectric film, or providing a layer containing or consisting of the element so as to be in contact with an upper surface of the piezoelectric film after the deposition of the piezoelectric film, wherein by performing the heat-treatment, the element in the layer containing or consisting of the element is allowed to diffuse into the piezoelectric film, and the piezoelectric film becomes a film which contains the element and in which an amount of the element present at a grain boundary of crystals constituting the piezoelectric film is greater than that of the element present in a matrix phase of the crystals.

(Supplementary Description 14)

According to further another aspect of the present disclosure, there is provided a method of manufacturing a piezoelectric stack, including:

depositing a piezoelectric film on a substrate as a poly-crystal film comprising a potassium sodium niobium oxide, that is, depositing a piezoelectric film on a substrate as a poly-crystal film comprising an alkali niobium oxide of a perovskite structure represented by a composition formula of $(K_{1-x}Na_x)NbO_3$ $(0<x<1)$;

depositing an electrode film containing at least one element selected from a group consisting of Cu and Mn on the piezoelectric film; and performing a heat-treatment to a stack including the substrate, the piezoelectric film, and the electrode film, wherein by performing the heat-treatment, the element in the electrode film is allowed to diffuse into the piezoelectric film, and the piezoelectric film becomes a film which contains the element and in which an amount of the element present at a grain boundary of crystals constituting the piezoelectric film is greater than that of the element present in a matrix phase of the crystals.

(Supplementary Description 15)

According to further another aspect of the present disclosure, there is provided a method of manufacturing a piezoelectric stack, including:

depositing a bottom electrode film on a substrate;

depositing a piezoelectric film on the bottom electrode film as a poly-crystal film comprising a potassium sodium niobium oxide, that is, depositing a piezoelectric film on the bottom electrode film as a poly-crystal film comprising an alkali niobium oxide of a perovskite structure represented by a composition formula of $(K_{1-x}Na_x)NbO_3$ $(0<x<1)$;

depositing a top electrode film on the piezoelectric film; and performing a heat-treatment to a stack including the substrate, the bottom electrode film, the piezoelectric film, and the top electrode film, wherein in the deposition of the bottom electrode film, at least one element selected from a group consisting of Cu and Mn is made to be contained in the bottom electrode film, or in the deposition of the top electrode film, the element is made to be contained in the top electrode film, and by performing the heat-treatment, the element in the bottom electrode film or the top electrode film is allowed to diffuse into the piezoelectric film, and the piezoelectric film becomes a film which contains the element and in which an amount of the element present at a grain boundary of crystals constituting the piezoelectric film is greater than that of the element present in a matrix phase of the crystals.

(Supplementary Description 16)

Preferably, there is provided the method according to the supplementary description 15, wherein in the deposition of the bottom electrode film, the element is made to be contained on a side closer to an upper surface of the bottom electrode film, and in the deposition of the top electrode film, the element is made to be contained on a side closer to a lower surface of the top electrode film.

DESCRIPTION OF SIGNS AND NUMERALS

1: Substrate
3: Piezoelectric film
10: Piezoelectric stack

What is claimed is:

1. A piezoelectric stack, comprising:
a substrate;
an electrode film; and
a piezoelectric film comprising a potassium sodium niobium oxide and Cu,
wherein the piezoelectric film is deposited by a sputtering method, a PLD (Pulsed Laser Deposition) method, or a sol-gel method;
the piezoelectric film is a polycrystalline film comprising a matrix phase and crystalline grains,
the piezoelectric film has a thickness of 0.5 µm or more and 5 µm or less,
80% or more of the crystalline grains of the piezoelectric film are oriented in (001) direction, and
an amount of Cu at a grain boundary of the crystalline grains is greater than that in the matrix phase.

2. The piezoelectric stack according to claim 1,
wherein when a positive or negative electric field of 300 kV/cm is applied at a temperature of 200° C. to the electrode film provided on the piezoelectric film, it takes 7600 seconds or more from a start of applying the electric field until a leakage current density flowing through the piezoelectric film exceeds 30 mA/cm$^2$ under at least one electric field applying condition.

3. A piezoelectric element, comprising:
a substrate;
a piezoelectric film deposited on the substrate; and
an electrode film deposited on the piezoelectric film,
wherein the piezoelectric film comprises a potassium sodium niobium oxide and Cu,
the piezoelectric film is a polycrystalline film comprising a matrix phase and crystalline grains,
the piezoelectric film has a thickness of 0.5 µm or more and 5 µm or less,
80% or more of the crystalline grains of the piezoelectric film are oriented in (001) direction, and
an amount of Cu at a grain boundary of the crystalline grains is greater than that in the matrix phase.

4. The piezoelectric stack according to claim 1,
wherein the piezoelectric film is constituted by crystal grains having an average grain size of 100 nm or more.

5. The piezoelectric stack according to claim 1,
wherein the piezoelectric film contains Cu at a concentration of 0.2 at % or more and 2.0 at % or less.

6. The piezoelectric element according to claim 3,
wherein the piezoelectric film is constituted by crystal grains having an average grain size of 100 nm or more.

7. The piezoelectric element according to claim 3,
wherein the piezoelectric film contains Cu at a concentration of 0.2 at % or more and 2.0 at % or less.

8. The piezoelectric stack according to claim 1, wherein the piezoelectric film is deposited by the sputtering method.

9. The piezoelectric stack according to claim 3, wherein the piezoelectric film is deposited by a sputtering method, a PLD (Pulsed Laser Deposition) method, or a sol-gel method.

10. The piezoelectric stack according to claim 3, wherein the piezoelectric film is deposited by a sputtering method.

* * * * *